(12) United States Patent
Tuttle

(10) Patent No.: US 10,834,853 B2
(45) Date of Patent: Nov. 10, 2020

(54) ELECTRONIC DEVICE WITH A CARD-LEVEL THERMAL REGULATOR MECHANISM AND ASSOCIATED SYSTEMS, DEVICES, AND METHODS

(71) Applicant: Micron Technology, Inc., Boise, ID (US)

(72) Inventor: Mark E. Tuttle, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 166 days.

(21) Appl. No.: 15/910,612

(22) Filed: Mar. 2, 2018

(65) Prior Publication Data

US 2019/0274232 A1   Sep. 5, 2019

(51) Int. Cl.

| | | |
|---|---|---|
| *F28F 13/00* | (2006.01) | |
| *F28D 15/02* | (2006.01) | |
| *G06F 1/20* | (2006.01) | |
| *H01L 23/473* | (2006.01) | |
| *H05K 7/20* | (2006.01) | |
| *H05K 7/14* | (2006.01) | |
| *H01F 6/04* | (2006.01) | |
| *F25D 19/00* | (2006.01) | |
| *F25D 29/00* | (2006.01) | |

(52) U.S. Cl.
CPC ....... *H05K 7/20372* (2013.01); *F25D 19/006* (2013.01); *F25D 29/001* (2013.01); *H01F 6/04* (2013.01); *H01L 23/473* (2013.01); *H05K 7/1464* (2013.01); *H05K 7/20436* (2013.01); *F28F 13/00* (2013.01); *G06F 1/206* (2013.01); *H05K 7/20836* (2013.01); *Y02D 10/16* (2018.01)

(58) Field of Classification Search
CPC ............. H05K 7/20372; H05K 7/1464; H05K 7/20436; F25D 19/006; F25D 29/001; H01F 6/04; H01L 23/473
USPC ....................................................... 365/244
See application file for complete search history.

(56) References Cited

U.S. PATENT DOCUMENTS

| | | |
|---|---|---|
| 4,931,852 A | 6/1990 | Brown et al. |
| 6,292,365 B1 | 9/2001 | Ashiwake et al. |
| 6,552,945 B2 | 4/2003 | Cooper et al. |
| 6,985,000 B2 | 1/2006 | Feder et al. |
| 7,265,993 B1* | 9/2007 | Slone ............... H05K 1/0234 361/760 |
| 9,286,991 B1 | 3/2016 | Walker |
| 9,761,543 B1 | 9/2017 | Male et al. |
| 2002/0037633 A1 | 3/2002 | Satou et al. |
| 2002/0076859 A1 | 6/2002 | Johnson et al. |
| 2005/0224849 A1 | 10/2005 | Isenberger et al. |

(Continued)

OTHER PUBLICATIONS

U.S. Appl. No. 15/910,590—Unpublished Patent Application by Mark E. Tuttle, titled "Electronic Device With a Package-Level Thermal Regulator Mechanism and Associated Systems, Devices, and Methods", filed Mar. 2, 2018, 21 pages.

*Primary Examiner* — Ly D Pham
(74) *Attorney, Agent, or Firm* — Perkins Coie LLP

(57) ABSTRACT

A semiconductor device includes a substrate; a first functional circuit attached to the substrate; a first thermal circuit attached to the substrate, configured to utilize cryogenic liquid to cool the first functional circuit; a second functional circuit attached to the substrate; and a second thermal circuit attached to the substrate, configured to cool the second functional circuit without using the cryogenic liquid.

17 Claims, 5 Drawing Sheets

(56) References Cited

U.S. PATENT DOCUMENTS

| | | | |
|---|---|---|---|
| 2007/0254411 A1 | 11/2007 | Uhland et al. | |
| 2008/0032446 A1* | 2/2008 | Wood | H01L 23/367 438/106 |
| 2009/0159904 A1 | 6/2009 | Lai et al. | |
| 2009/0244842 A1* | 10/2009 | Iwakiri | H05K 7/20727 361/695 |
| 2010/0230807 A1 | 9/2010 | Bronner et al. | |
| 2011/0114840 A1 | 5/2011 | Yamazaki et al. | |
| 2011/0193008 A1 | 8/2011 | Fieback et al. | |
| 2012/0035773 A1* | 2/2012 | Stabinski | F25B 49/025 700/282 |
| 2012/0097361 A1* | 4/2012 | Yang | F28D 15/00 165/45 |
| 2012/0120582 A1* | 5/2012 | Nguyen | G06F 1/185 361/679.31 |
| 2012/0320523 A1* | 12/2012 | Murakami | G06F 1/20 361/679.54 |
| 2013/0126013 A1 | 5/2013 | Peterson et al. | |
| 2013/0139524 A1 | 6/2013 | Kim et al. | |
| 2013/0194057 A1 | 8/2013 | Ruby | |
| 2013/0264610 A1 | 10/2013 | Chen et al. | |
| 2014/0063721 A1 | 3/2014 | Herman et al. | |
| 2014/0159231 A1 | 6/2014 | Lundberg | |
| 2014/0183957 A1* | 7/2014 | Duchesneau | F01K 13/006 307/64 |
| 2014/0374726 A1 | 12/2014 | Goeoetz et al. | |
| 2015/0092509 A1 | 4/2015 | Kim | |
| 2016/0113127 A1 | 4/2016 | Salminen et al. | |
| 2016/0161314 A1 | 6/2016 | Hunziker et al. | |
| 2016/0334845 A1 | 11/2016 | Mittal et al. | |
| 2017/0014174 A1* | 1/2017 | Levine | F17O 13/003 |
| 2017/0118860 A1* | 4/2017 | Miwa | H05K 7/1489 |
| 2019/0103579 A1 | 4/2019 | Kim et al. | |

\* cited by examiner

ELECTRONIC DEVICE WITH A CARD-LEVEL THERMAL REGULATOR MECHANISM AND ASSOCIATED SYSTEMS, DEVICES, AND METHODS

RELATED APPLICATION(S)

This application contains subject matter related to a concurrently filed U.S. patent application by Mark Tuttle titled "ELECTRONIC DEVICE WITH A PACKAGE-LEVEL THERMAL REGULATOR MECHANISM AND ASSOCIATED SYSTEMS, DEVICES, AND METHODS." The related application is assigned to Micron Technology, Inc., and is identified by Ser. No. 15/910,590. The subject matter thereof is incorporated herein by reference thereto.

TECHNICAL FIELD

The present technology is related to electronic devices, and, in particular, to electronic devices with a card-level temperature regulating mechanism.

BACKGROUND

Electronic devices (e.g., card-level devices) typically include one or more semiconductor devices or components mounted on another structure (e.g., a printed circuit board (PCB)). For example, the electronic devices can include dies or die packages (e.g., processors, memory chips, etc.) that include functional features, such as for memory cells, processor circuits, and imager devices, as well as interconnects that are electrically connected to the functional features.

Different portions/circuits/devices within the electronic devices can behave differently at different temperatures. For example, at higher temperatures, an electronic device can experience data errors (e.g., during operation) and/or structural failures (e.g., exacerbated by or independent of device operation). Generally, operating electronic devices at lower temperatures can permit faster operation and/or better performance (e.g., reduced noise). At extremely low (e.g., cryogenic) operating temperatures, however, some electronic devices can experience other undesirable effects, including reduced performance and/or structural failures (e.g., due in part to a thermal gradient between heat-generating features of the device and other portions of the device).

DETAILED DESCRIPTION

Figure 1:
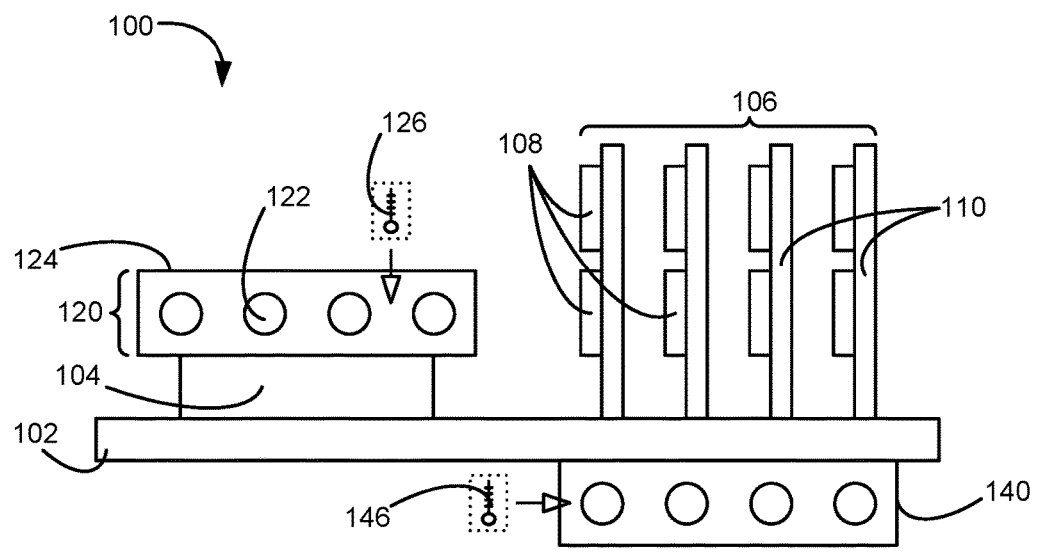
FIG. 1 is a cross-sectional view of an electronic device in accordance with an embodiment of the present technology.

The technology disclosed herein relates to electronic devices (e.g., card-level devices having one or more semiconductor devices thereon), systems including the electronic devices, and related methods for manufacturing and operating the electronic devices and systems. The term "semiconductor device" generally refers to a solid-state device that includes one or more semiconductor materials. Examples of semiconductor devices include logic devices, memory devices, imagers, and diodes, among others. Furthermore, the term "semiconductor device" can refer to a finished device or to an assembly or other structure at various stages of processing before becoming a finished device. Depending upon the context in which it is used, the term "substrate" can refer to a structure that supports electronic components (e.g., a die), such as a wafer-level substrate or to a singulated die-level substrate, another die for die-stacking or 3DI applications, or PCBs. A person having ordinary skill in the relevant art will recognize that suitable steps of the methods described herein can be performed at the wafer-level, at the die level, at the package level, or at the card-level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

Many embodiments of the present technology are described below in the context of regulating operating temperature of the electronic devices. For example, the electronic devices can include one or more temperature-control components (e.g., heating elements, such as die-level heaters, package-level heaters, and/or card-level heaters, cooling devices, etc.) to keep a temperature of specific components (e.g., the corresponding operating temperatures) at different temperatures.

In some instances, one device or system can include components or subsystems (e.g., logic dies) that benefit from lower (e.g., cryogenic) operating temperatures, along with other components or subsystems (e.g., memory dies) that benefit from relatively higher operating temperatures. For such devices, the overall device or system can implement multiple temperature regulating components (e.g., a first thermal-regulator for reducing the operating temperature to at or near cryogenic levels and a second thermal-regulator for maintaining the operating temperature between the cryogenic levels and ambient temperatures.

In some embodiments, the electronic devices can include one or more heating elements (e.g., resistors configured to increase thermal energy independent of circuit/signal contributions) on or embedded within semiconductor dies, substrates, encapsulations, PCBs, or a combination thereof. For example, the first thermal-regulator can include cryogenic liquid cooling circuit configured to cool a circuit (e.g., a logic circuit, such as a central processing unit), and the second thermal-regulator can include a liquid (e.g., non-cryogenic) cooling circuit or an air-cooling circuit configured to cool a second circuit (e.g., a memory circuit, such as a dual-inline-memory-modules (DIMMs)). Also for example, the first thermal-regulator can include a cryogenic bath for the overall device/system, and the second thermal-regulator can include a heating element (e.g., a die-level or package-level heater).

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down and left/right can be interchanged depending on the orientation.

FIG. 1 is a profile view of an electronic device 100 (e.g., a circuit assembly including a semiconductor die assembly or package, such as a 3DI device or a die-stacked package) in accordance with an embodiment of the present technology. The electronic device 100 can include a circuit substrate 102 (e.g., PCB) for supporting and/or electrically connecting (e.g., using traces and/or wires on or integral with the circuit substrate 102) electronic components (e.g., processors, memories, passive or analog devices, etc.). For example, the electronic device 100 can include a first functional circuit 104 and a second functional circuit 106 attached to the circuit substrate 102.

The electronic device 100 can include components that are configured to perform different functions. For example, the first functional circuit 104 can include a semiconductor device (e.g., a semiconductor die or package) configured to perform logic manipulation/calculations (e.g., for devices including one or more logic dies, such as processors central processing units (CPU), etc.). The second functional circuit 106 can include one or more semiconductor devices 108 (e.g., non-volatile memory, such as magnetic storage or flash memory devices, and/or volatile memory, such as random access memory (RAM)) attached to one or more component substrates 110. The second functional circuit 106 can be configured to store data and provide access to previously stored data. In some embodiments, the second functional circuit 106 can include one or more dual in-line memory modules (DIMMs).

Based on the different configurations/functions of the components, the electronic device 100 can include components that have different targeted operating temperatures. For example, the first functional circuit 104 (e.g., including logic dies) can benefit from lower (e.g., cryogenic) operating temperatures. The second functional circuit 106 (e.g., memory devices) can benefit from operating temperatures higher than the first functional circuit 104. In some embodiments, the targeted operating temperature of the second functional circuit 106 can be in a range that is above cryogenic temperatures and up to or about ambient temperatures.

Accordingly, the electronic device 100 can include components/circuits configured to regulate/manage the operating temperature of one or more components thereon. For example, the electronic device 100 can include a first thermal circuit 120 configured to regulate/manage a first operating temperature 126 of the first functional circuit 104, and a second thermal circuit 140 configured to regulate/manage a second operating temperature 146 of the second functional circuit 106.

In some embodiments, the first thermal circuit 120 can be configured to cool the first functional circuit 104 and/or maintain the first operating temperature 126 at or near cryogenic temperatures. For example, the first thermal circuit 120 can include a cryogenic liquid cooling circuit that includes or utilize (e.g., circulates) cryogenic liquid 122 (e.g., liquid form of argon helium, nitrogen, etc.) that is thermally coupled to the first functional circuit 104 (e.g., through a thermal conductor of the first thermal circuit that is configured to remove thermal energy from the first functional circuit 104). The cryogenic liquid 122 can correspond to a boiling point at or below negative 150 degrees Celsius, or at or below negative 180 degrees Celsius (e.g., cryogenic levels).

The cryogenic liquid 122 can be contained within an enclosure 124 and physically separated from (e.g., without direct contact to) the first thermal circuit 120. The enclosure 124 can directly contact or be attached (e.g., using thermally conductive mechanical fasteners or adhesives) to the first functional circuit 104 (e.g., at a surface thereof opposite the circuit substrate 102). The enclosure 124 can include a thermally conductive structure that is configured to transfer thermal energy away from the first thermal circuit 120 (e.g., through the direct contact, the attachment mechanism, a heat sync or a different heat transfer mechanism thermally coupled to the first functional circuit 104 and the cryogenic liquid 122).

In some embodiments, the second thermal circuit 140 can be configured to cool the second functional circuit 106 for maintaining the second operating temperature 146 above the cryogenic temperatures. For example, the second thermal circuit 140 can include a circuit that does not use a cryogenic liquid, such as an air-cooling circuit or a liquid-cooling circuit that utilizes non-cryogenic liquids (e.g., water).

The separate cooling circuits (e.g., the first thermal circuit 120 including/utilizing the cryogenic liquid 122 and the second thermal circuit 140 separate from the first thermal circuit 120) can improve the efficiency of the electronic device 100. The first thermal circuit 120 can maintain the first operating temperature 126 at or near cryogenic temperatures and the second thermal circuit 140 can maintain the second operating temperature 146 at a different temperature above cryogenic levels. Accordingly, the electronic device 100 can maintain different operating temperatures for the first functional circuit 104 and second functional circuit 106 that correspond to improved performance of the corresponding circuits. Further, the separate cooling circuits can allow the electronic device 100 to implement or utilize devices that improve performance in extremely cold temperatures (e.g., for super computers) along with other cheaper or readily-available support devices (e.g., memory modules).

For brevity, certain aspects of the cooling system are not shown. However, one of ordinary skill in the art can appreciate that the electronic device 100 would include or operate with other components or devices. For example, the first thermal circuit 120, the second thermal circuit 140, or a combination thereof can further include or operably couple to a monitoring circuit that senses the operating temperature of the target device (e.g., the first operating temperature 126 or the second operating temperature 146), a compressor to cool the liquid, pump to circulate the liquid, a fan, a controlling circuit that operate different components or devices in the cooling circuit (e.g., for adjusting the operating temperature), etc.

Figure 2:
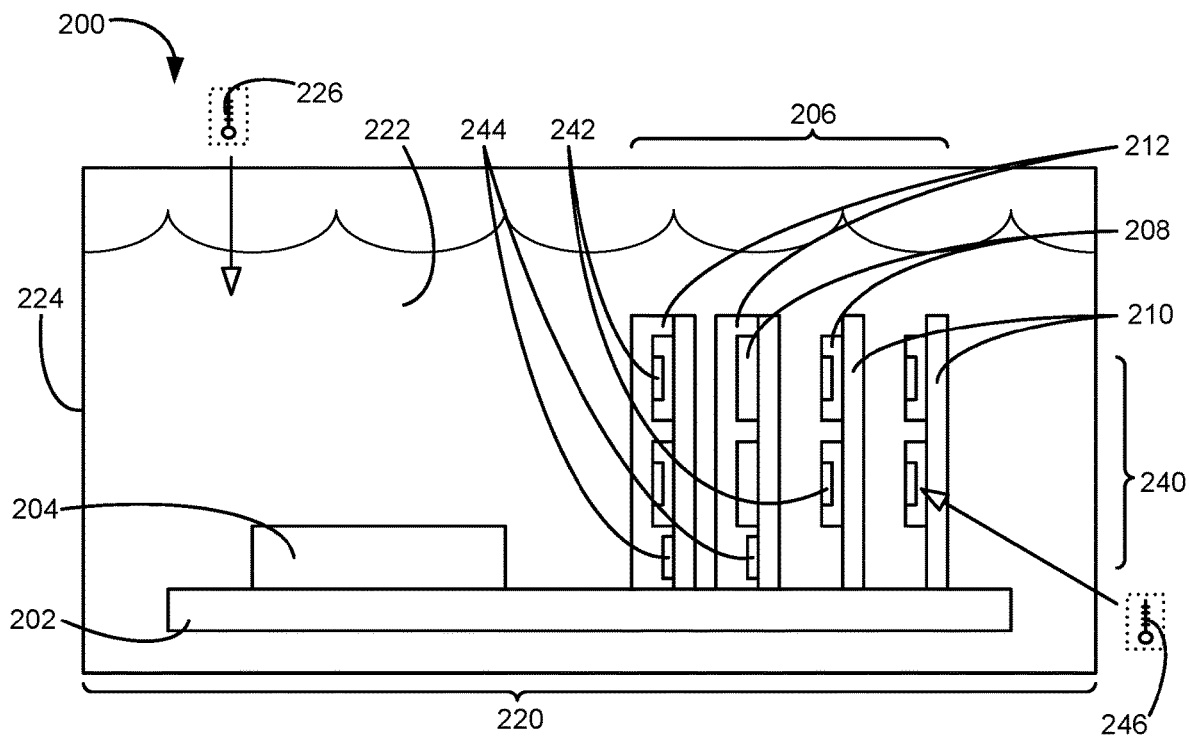
FIG. 2 is a cross-sectional view of an electronic device in accordance with a further embodiment of the present technology.

FIG. 2 is a cross-sectional view of an electronic device 200 (e.g., a circuit assembly including a semiconductor die assembly or package, such as a 3DI device or a die-stacked package) in accordance with a further embodiment of the present technology. The electronic device 200 can include a circuit substrate 202 (e.g., PCB) for supporting and/or electrically connecting (e.g., using traces and/or wires on or integral with the circuit substrate 202) electronic components (e.g., processors, memories, passive or analog devices, etc.). For example, the electronic device 200 can include a first functional circuit 204 and a second functional circuit 206 attached to the circuit substrate 202.

The electronic device 200 can include components that are configured to perform different functions. For example, the first functional circuit 204 can include a semiconductor device (e.g., a semiconductor die or package) configured to perform logic manipulation/calculations (e.g., for devices including one or more logic dies, such as processors central processing units (CPU), etc.). The second functional circuit 206 can include one or more semiconductor devices 208 (e.g., non-volatile memory, such as magnetic storage or flash memory devices, and/or volatile memory, such as random access memory (RAM)) attached to one or more component substrates 210. The second functional circuit 206 can be configured to store data and provide access to previously stored data. In some embodiments, the second functional circuit 206 can include one or more dual in-line memory modules (DIMMs).

In some embodiments, the components can include a component cover 212. The component cover 212 (e.g., a case or an encapsulation) can enclose or encapsulate a circuit, a component, a portion thereof, or a combination thereof in the corresponding device. As illustrated in FIG. 2, some of the second functional circuits (e.g., DIMMs) can include the component cover 212 covering the semiconductor device 208, the component substrate 210, a portion thereof, or a combination thereof. The component cover 212 can physically separate or isolate the covered circuits from an external environment.

Based on the different configurations/functions of the components, the electronic device 200 can include components that have different targeted operating temperatures. For example, the first functional circuit 204 (e.g., including logic dies) can benefit from lower (e.g., cryogenic) operating temperatures. The second functional circuit 206 (e.g., memory devices) can benefit from operating temperatures higher than the first functional circuit 204. In some embodiments, the targeted operating temperature of the second functional circuit 206 can be in a range that is above cryogenic temperatures and up to or about ambient temperatures.

Accordingly, the electronic device 200 can include components/circuits configured to regulate/manage the operating temperature of one or more components thereon. For example, the electronic device 200 can include a first thermal circuit 220 configured to regulate/manage a first operating temperature 226 of the first functional circuit 204, and a second thermal circuit 240 configured to regulate/manage a second operating temperature 246 of the second functional circuit 206.

In some embodiments, the first thermal circuit 220 can be configured to cool the first functional circuit 204 and/or maintain the first operating temperature 226 at or near cryogenic temperatures. For example, the first thermal circuit 220 can include a cryogenic bath for submerging the circuit substrate 202 and components/circuits attached thereon in cryogenic liquid 222 (e.g., liquid argon helium, nitrogen, etc.). Accordingly, the cryogenic liquid 222 can directly contact the first functional circuit 204 and lower the first operating temperature 226. The cryogenic liquid 222 can be contained within an enclosure 224 (e.g., a thermal insulator and/or a sealed container for keeping the cryogenic liquid 222 and/or the evaporated gases enclosed therein and/or circulating through a thermal control system, such as an external cooler).

Accordingly, the second thermal circuit 240 can be configured to maintain the second operating temperature 246 above the cryogenic temperatures. When the second thermal circuit 240 is submerged in the cryogenic liquid 222, the second thermal circuit 240 can heat the second thermal circuit 240 to maintain the second operating temperature 246 above the cryogenic temperatures.

In some embodiments, the second thermal circuit 240 can include one or more die-level heaters 242 (e.g., resistors attached to or integral with, such as at semiconductor level, the second functional circuit 206) configured to directly heat the corresponding circuit/device. In some embodiments, the second thermal circuit 240 can include one or more package-level heaters 244 (e.g., resistors attached to or integral with the component substrate 210 and physically separated from the semiconductor device 208) configured to heat the second thermal circuit 240 in entirety. The second thermal circuit 240 can include the component cover 212 configured to transfer thermal energy from the package-level heater 244 to the semiconductor device 208 (e.g., based on thermally conductive components in the component substrate 210). The second thermal circuit 240 can further include the component cover 212 (e.g., an outer layer) configured to thermally isolate the semiconductor device 208 from the cryogenic liquid 222.

The separate thermal control circuits (e.g., the first thermal circuit 220 utilizing the cryogenic liquid 222 for a cryogenic bath and the second thermal circuit 240 separate from the first thermal circuit 220) can improve the efficiency of the electronic device 200. The first thermal circuit 220 can maintain the first operating temperature 226 at or near cryogenic temperatures and the second thermal circuit 240 can maintain the second operating temperature 246 at a different temperature above cryogenic levels. Accordingly, the electronic device 200 can maintain different operating temperatures for the first functional circuit 204 and second functional circuit 206 that correspond to improved performance of the corresponding circuits.

Figure 3A:
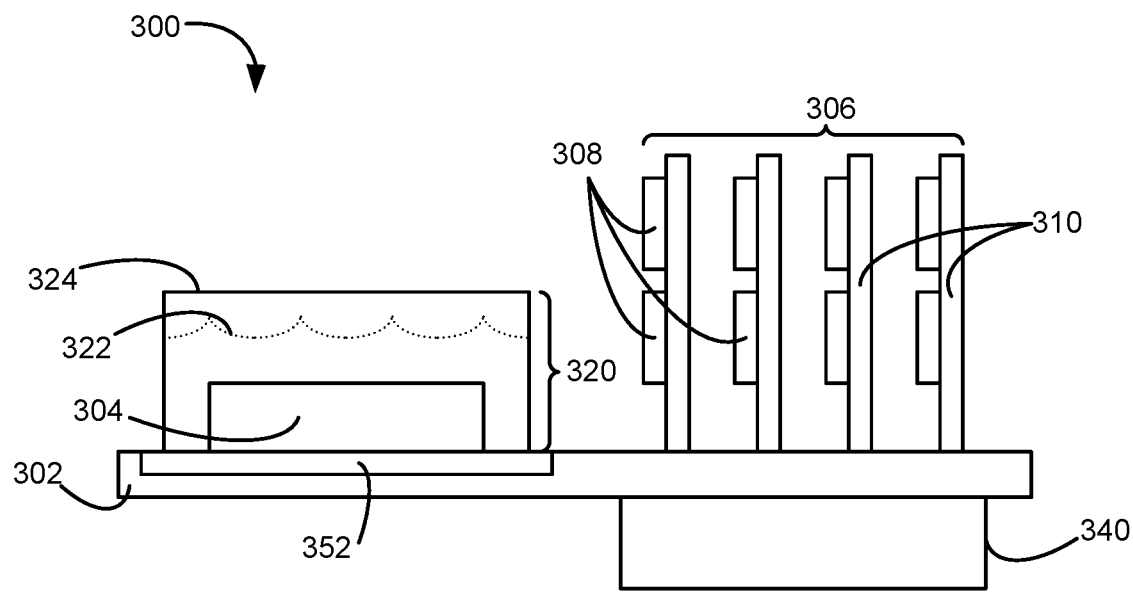
FIG. 3A is a cross-sectional view of an electronic device along a line 3-3 in FIG. 3B in accordance with a further embodiment of the present technology.
Figure 3B:
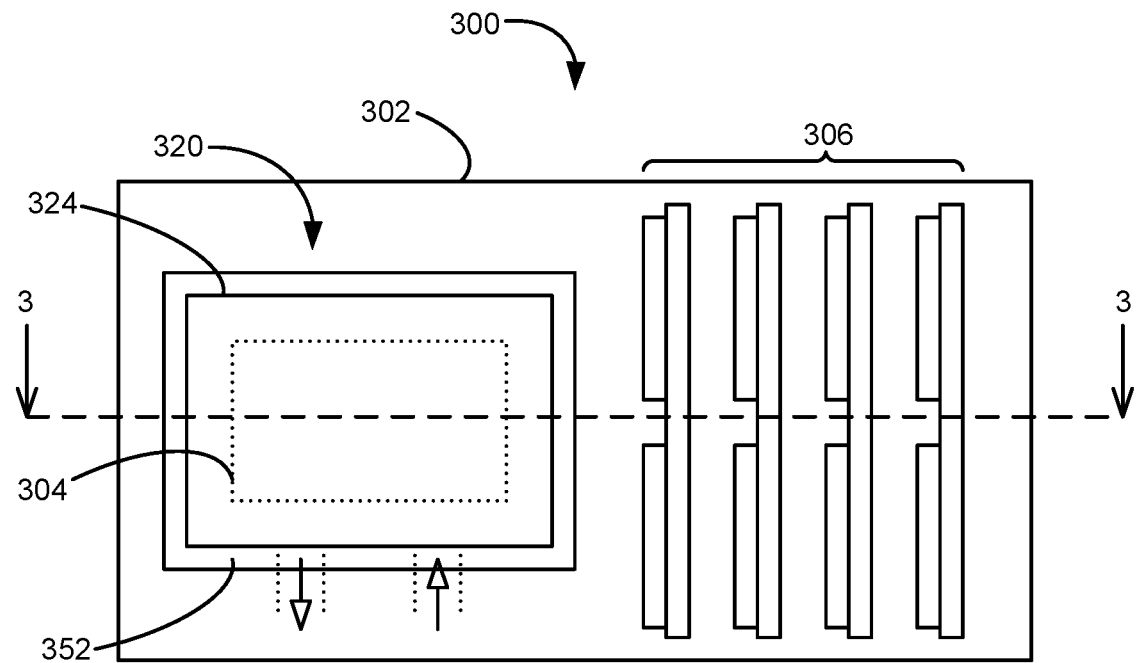
FIG. 3B is a top view of the electronic device of FIG. 3A in accordance with a further embodiment of the present technology.

FIG. 3A is a cross-sectional view of an electronic device 300 (e.g., a circuit assembly including a semiconductor die assembly or package, such as a 3DI device or a die-stacked package) along a line 3-3 in FIG. 3B in accordance with a further embodiment of the present technology. The electronic device 300 can include a circuit substrate 302 (e.g., PCB) for supporting and/or electrically connecting (e.g., using traces and/or wires on or integral with the circuit substrate 302) electronic components (e.g., processors, memories, passive or analog devices, etc.). For example, the electronic device 300 can include a first functional circuit 304 and a second functional circuit 306 attached to the circuit substrate 302.

The electronic device 300 can include components that are configured to perform different functions. For example, the first functional circuit 304 can include a semiconductor device (e.g., a semiconductor die or package) configured to perform logic manipulation/calculations (e.g., for devices including one or more logic dies, such as processors central processing units (CPU), etc.). The second functional circuit 306 can include one or more semiconductor devices 308 (e.g., non-volatile memory, such as magnetic storage or flash memory devices, and/or volatile memory, such as random access memory (RAM)) attached to one or more component substrates 310. The second functional circuit 306 can be configured to store data and provide access to previously stored data. In some embodiments, the second functional circuit 306 can include one or more dual in-line memory modules (DIMMs).

Based on the different configurations/functions of the components, the electronic device 300 can include components that have different targeted operating temperatures. For example, the first functional circuit 304 (e.g., including logic dies) can benefit from lower (e.g., cryogenic) operating temperatures. The second functional circuit 306 (e.g., memory devices) can benefit from operating temperatures higher than the first functional circuit 304. In some embodiments, the targeted operating temperature of the second functional circuit 306 can be in a range that is above cryogenic temperatures and up to or about ambient temperatures.

Accordingly, the electronic device 300 can include components/circuits configured to regulate/manage the operating temperature of one or more components thereon. For example, the electronic device 300 can include a first thermal circuit 320 configured to regulate/manage a first operating temperature 326 of the first functional circuit 304, and a second thermal circuit 340 configured to regulate/manage a second operating temperature 346 of the second functional circuit 306.

In some embodiments, the first thermal circuit 320 can be configured to cool the first functional circuit 304 and/or maintain the first operating temperature 326 at or near cryogenic temperatures. For example, the first thermal circuit 320 can include cryogenic liquid 322 (e.g., liquid argon helium, nitrogen, etc.) contained within an enclosure 324 (e.g., a thermal insulator and/or a sealed container for keeping the cryogenic liquid 322 and/or the evaporated gases enclosed therein and/or circulating through a thermal control system, such as an external cooler). The enclosure 324 can enclose the first functional circuit 304 therein, such that the cryogenic liquid 322 directly contacts the first functional circuit 304 for cooling the circuit and lowering the first operating temperature 326.

Accordingly, the second thermal circuit 340 can be configured to maintain the second operating temperature 346 above the cryogenic temperatures. When the second thermal circuit 340 is submerged in the cryogenic liquid 322, the second thermal circuit 340 can heat the second thermal circuit 340 to maintain the second operating temperature 346 above the cryogenic temperatures.

In some embodiments, the circuit substrate 302 can include thermal isolation mechanism 352 (e.g., thermal insulator, a structure incorporating one or more vacuum layers, etc.) on a top surface of the circuit substrate 302. The thermal isolation mechanism 352 can be under and attached to the first functional circuit 304, the enclosure 324, the second functional circuit 306, or a combination thereof. The thermal isolation mechanism 352 can isolate the thermal influence of the cryogenic liquid 322 from the second functional circuit 306, remaining portions of the circuit substrate 302, or a combination thereof.

The separate thermal control circuits (e.g., the first thermal circuit 320 utilizing the cryogenic liquid 322 for a cryogenic bath and the second thermal circuit 340 separate from the first thermal circuit 320) can improve the efficiency of the electronic device 300. The first thermal circuit 320 can maintain the first operating temperature 326 at or near cryogenic temperatures and the second thermal circuit 340 can maintain the second operating temperature 346 at a different temperature above cryogenic levels. Accordingly, the electronic device 300 can maintain different operating temperatures for the first functional circuit 304 and second functional circuit 306 that correspond to improved performance of the corresponding circuits.

FIG. 3B is a top view of the electronic device 300 of FIG. 3A in accordance with a further embodiment of the present technology. In some embodiments, the thermal isolation mechanism 352 (e.g., thermal insulator) can be on the top surface of the circuit substrate and localized to a portion corresponding to the first functional circuit 304, the first thermal circuit 320 (e.g., the enclosure 324, the cryogenic liquid 322, etc.), or a combination thereof. For example, the peripheral edge of the thermal isolation mechanism 352 can be between the first functional circuit 304 and the second functional circuit 306.

Figure 4:
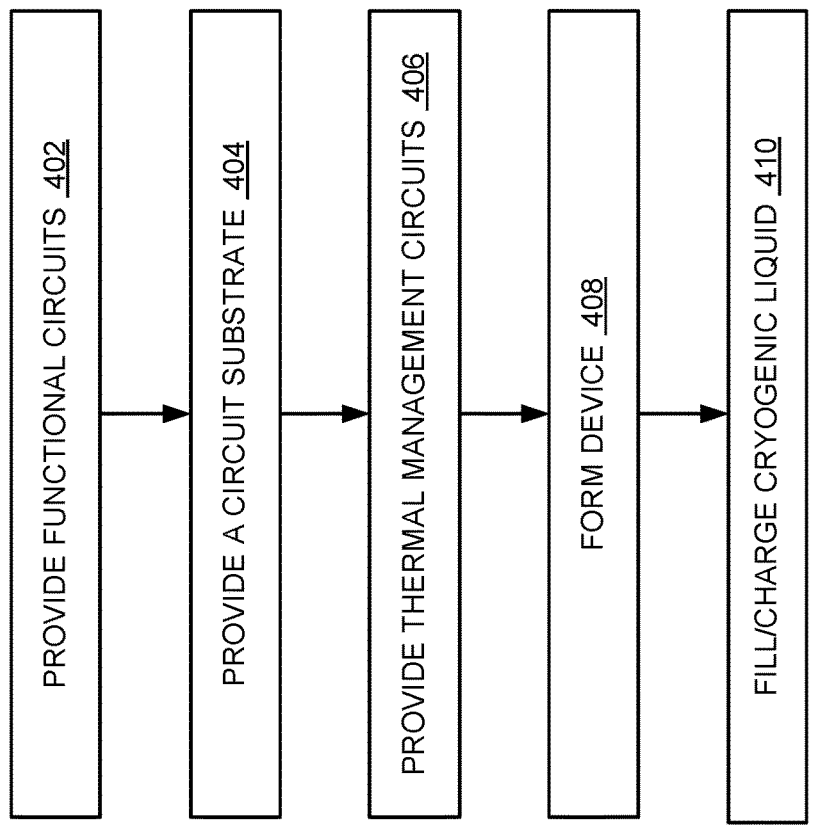
FIG. 4 is a flow diagram illustrating an example method of manufacturing an electronic device in accordance with an embodiment of the present technology.

FIG. 4 is a flow diagram illustrating an example method 400 of manufacturing an electronic device in accordance with an embodiment of the present technology. For example, the method 400 can be for manufacturing the electronic device 100 of FIG. 1, the electronic device 300 of FIGS. 3A and 3B, or a combination thereof.

At block 402, one or more functional circuits (e.g., semiconductor dies, packages, circuit cards, etc.) can be provided. For example, a first functional circuit (e.g., the first functional circuit 104 of FIG. 1, the first functional circuit 204 of FIG. 2, the first functional circuit 304 of FIG. 3, etc., such as a processor or a CPU) and a second functional circuit (e.g., the second functional circuit 106 of FIG. 1, the second functional circuit 206 of FIG. 2, the second functional circuit 306 of FIG. 3, etc., such as a memory or a data storage circuit) can be provided for manufacturing the electronic device. In some embodiments, providing the functional circuits can include manufacturing or forming the dies (e.g., based on wafer-level processing), assembling or forming the packages (e.g., based on attaching and connecting electronic components), assembling or forming the circuit cards, etc. In some embodiments, providing the functional circuits can include positioning the dies, packages, circuit cards, components therein, or a combination thereof.

At block 404, a circuit substrate (e.g., the circuit substrate 102 of FIG. 1, the circuit substrate 202 of FIG. 2, the circuit substrate 302 of FIG. 3, etc., such as PCB) can be provided. In some embodiments, providing the circuit substrate can include forming the PCB (e.g., forming vias and/or traces, such as based on depositing and removing conductive materials and electrical insulators). In some embodiments, providing the circuit substrate can include attaching electronic components (e.g., passive or analog components, digital components, power sources or connections, etc.). In some embodiments, providing the circuit substrate can include positioning the dies, packages, circuit cards, components therein, or a combination thereof.

At block 406, thermal management circuits can be provided for managing operating temperatures of the functional circuits. For example, a first thermal circuit (e.g., the first thermal circuit 120 of FIG. 1, the first thermal circuit 220 of FIG. 2, the first thermal circuit 320 of FIG. 3, etc., such as a cryogenic liquid cooling circuit or a cryogenic bath for an overall circuit card or a portion thereof) can be provided for managing a first operating temperature of the first functional circuit. The first thermal circuit can include an enclosure (e.g., the enclosure 124 of FIG. 1, the enclosure 224 of FIG. 2, the enclosure 324 of FIG. 3, etc.) configured to contain and/or circulate cryogenic liquid (e.g., the cryogenic liquid 122 of FIG. 1, the cryogenic liquid 222 of FIG. 2, the cryogenic liquid 322 of FIG. 3, etc.). Also for example, a second thermal circuit (e.g., the second thermal circuit 140 of FIG. 1, the second thermal circuit 240 of FIG. 2, the second thermal circuit 340 of FIG. 3, etc.) can be provided for managing a second operating temperature (e.g., higher than the first operating temperature, such as non-cryogenic temperature) of the second functional circuit without using the cryogenic liquid. The second thermal circuit can include an air-cooling circuit or a liquid-cooling circuit that utilizes non-cryogenic liquid (e.g., water).

In some embodiments, thermal conductors can be configured for managing operating temperatures. For example, the enclosure can be attached to the first functional circuit. Also for example, the enclosure can be attached over and enclosing the first functional circuit, such as over thermal isolation material/mechanism. Also for example, heat syncs can be connected to the first functional circuit and be connected or placed within the enclosure. The second thermal circuit can be similarly configured relative to the second functional circuit.

At block 408, the electronic device can be formed. Forming the electronic device can include assembling, connecting, and/or attaching components to the circuit substrate. For example, the first functional circuit, the second functional circuit, the first thermal circuit, the second thermal circuit, or a combination thereof can be attached to the circuit substrate. Forming the electronic device can further include electrically connecting the circuits.

At block 410, the first thermal circuit can be filled or charged with the cryogenic liquid. For example, the enclosure of the first thermal circuit can be filled with the cryogenic liquid. Filling or charging the cryogenic liquid can include completing the cooling circuit, such as by connecting conduits for circulating the cryogenic liquid, connecting to a cooler or a supply tank, etc.

Figure 5:
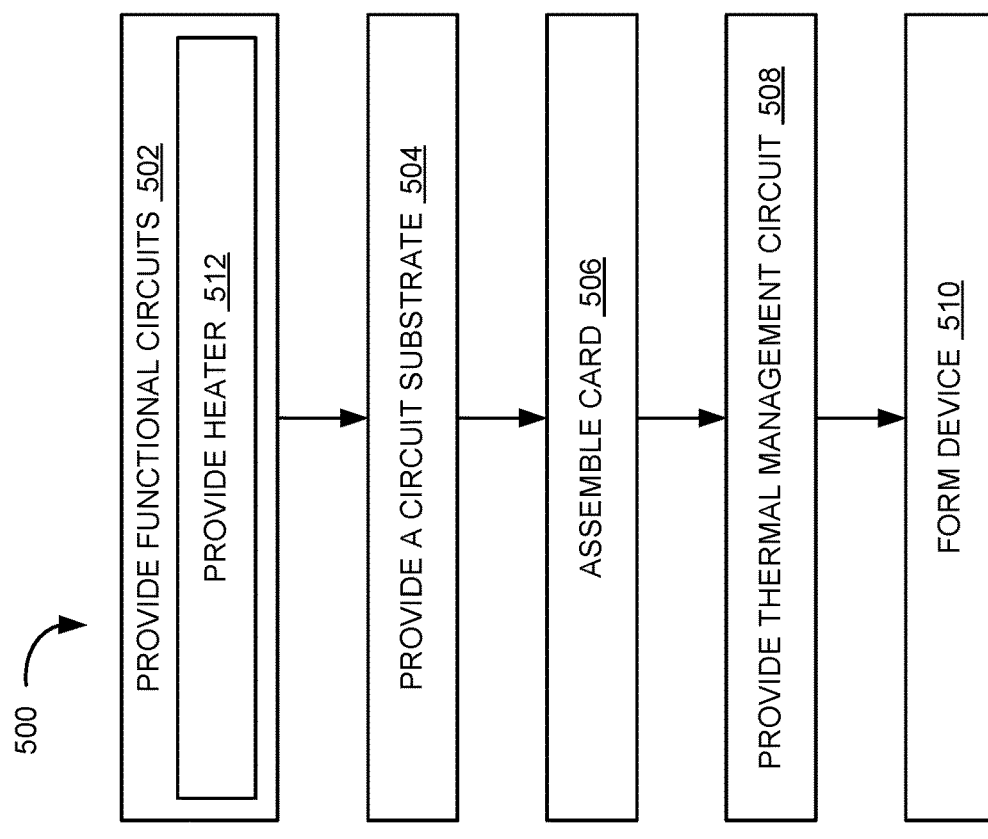
FIG. 5 is a flow diagram illustrating a further example method of manufacturing an electronic device in accordance with an embodiment of the present technology.

FIG. 5 is a flow diagram illustrating an example method 500 of manufacturing an electronic device in accordance with an embodiment of the present technology. For example, the method 500 can be for manufacturing the electronic device 200 of FIG. 2.

At block 502, one or more functional circuits (e.g., semiconductor dies, packages, circuit cards, etc.) can be provided. For example, a first functional circuit (e.g., the first functional circuit 104 of FIG. 1, the first functional circuit 204 of FIG. 2, the first functional circuit 304 of FIG. 3, etc., such as a processor or a CPU) and a second functional circuit (e.g., the second functional circuit 106 of FIG. 1, the second functional circuit 206 of FIG. 2, the second functional circuit 306 of FIG. 3, etc., such as a memory or a data storage circuit) can be provided for manufacturing the electronic device. In some embodiments, providing the functional circuits can include manufacturing or forming the dies (e.g., based on wafer-level processing), assembling or forming the packages (e.g., based on attaching and connecting electronic components), assembling or forming the circuit cards, etc. In some embodiments, providing the functional circuits can include positioning the dies, packages, circuit cards, components therein, or a combination thereof.

In some embodiments, providing the functional circuits can include providing temperature regulating circuits (e.g., thermal circuits). At block 512, one or more heating elements (e.g., the second thermal circuit 240 of FIG. 2, such as resistors) can be provided. For example, the second functional circuit can be provided with the die-level heater 342 of FIG. 3 attached thereto or integral therein. Also for example, the package-level heater 344 of FIG. 3 can be provided.

In some embodiments, forming the second functional circuit can include forming the die-level heater 342 on or integral with semiconductor device of the second functional circuit. In some embodiments, forming the second functional circuit can include attaching the package-level heater 344 to the component substrate of the second functional circuit. In some embodiments, forming the second functional circuit can include attaching or forming the component cover.

At block 504, a circuit substrate (e.g., the circuit substrate 102 of FIG. 1, the circuit substrate 202 of FIG. 2, the circuit substrate 302 of FIG. 3, etc., such as PCB) can be provided. In some embodiments, providing the circuit substrate can include forming the PCB (e.g., forming vias and/or traces, such as based on depositing and removing conductive materials and electrical insulators). In some embodiments, providing the circuit substrate can include positioning the dies, packages, circuit cards, components therein, or a combination thereof.

At block 506, the circuit substrate can be populated with components. Populating the components can include attaching electronic components (e.g., passive or analog components, digital components, power sources or connections, etc.) to the circuit substrate. Populating the components can further include attaching the functional circuits. For example, populating the components can include attaching a logic circuit (e.g., the first functional circuit) and attaching a memory circuit having the heater thereon.

At block 508, thermal management circuit can be provided. In some embodiments, providing the thermal management circuit can include providing the first thermal management circuit configured to contain the cryogenic liquid. For example, providing the thermal management circuit can include providing (e.g., forming or locating) the enclosure for a cryogenic bath.

At block 510, the electronic device can be formed. Forming the electronic device can include placing the assembled circuit (e.g., the overall card) in the enclosure. Forming the electronic device can further include filling the enclosure with the cryogenic liquid and submerging the assembled circuit in the cryogenic liquid.

Figure 6:
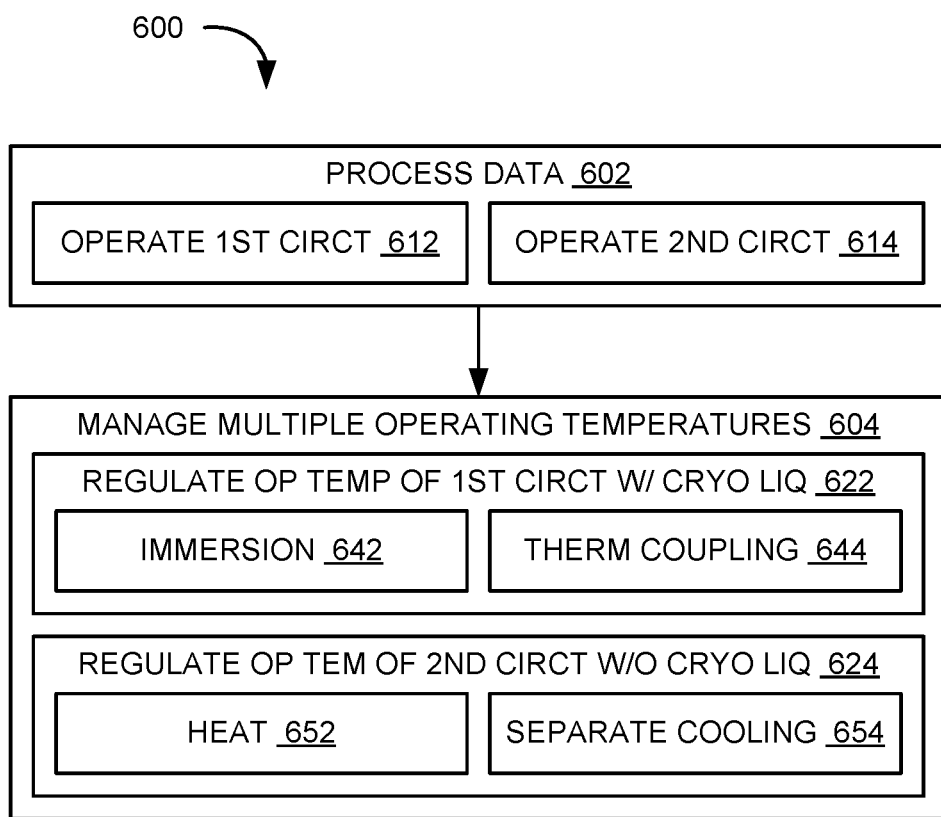
FIG. 6 is a flow diagram illustrating an example method of operating an electronic device in accordance with an embodiment of the present technology.

FIG. 6 is a flow diagram illustrating an example method 600 of operating an electronic device in accordance with an embodiment of the present technology. For example, the method 600 can be for operating the electronic device 100 of FIG. 1, the electronic device 200 of FIG. 2, the electronic device 300 of FIGS. 3A and 3B, or a combination thereof.

At block 602, operating the electronic device can include processing data. For example, the electronic device can process data using a first functional circuit (e.g., the first functional circuit 104 of FIG. 1, the first functional circuit 204 of FIG. 2, the first functional circuit 304 of FIGS. 3A and 3B, etc., such as a processor or a CPU) and a second functional circuit (e.g., the second functional circuit 106 of FIG. 1, the second functional circuit 206 of FIG. 2, the second functional circuit 306 of FIG. 3, etc., such as a memory or a data storage device). At block 612, the electronic device can operate the first functional circuit (e.g., logic circuit). At block 614, the electronic device can operate the second functional circuit (e.g., the memory or data storage device).

At block 604, the electronic device can manage multiple different operating temperatures for different components therein. The electronic device can manage different operating temperatures based on operating thermal regulator circuits that are each configured to manage operating temperature of a corresponding device.

For example, at block 622, the electronic device can regulate the operating temperature (e.g., the first operating temperature) of the first functional circuit using cryogenic liquid. The electronic device can regulate the operating temperature using a first thermal circuit (e.g., the first thermal circuit 120 of FIG. 1, the first thermal circuit 220 of FIG. 2, the first thermal circuit 320 of FIGS. 3A and 3B, etc.) configured to contain and utilize the cryogenic liquid to cool the first functional circuit.

In some embodiments, such as at block 642, regulating the operating temperature with the first thermal circuit can include implementing a cryogenic bath that submerges the first functional circuit in the cryogenic liquid. For example, the first thermal circuit 220 can be for submerging the circuit substrate 202 of FIG. 2 and all components attached thereon in the cryogenic liquid 222 of FIG. 2. Also for example, the first thermal circuit 320 can be for enclosing the first functional circuit without enclosing the second functional circuit or other components on the circuit substrate 302 of FIGS. 3A and 3B. Implementing the cryogenic bath can include circulating the cryogenic liquid, supplying the cryogenic liquid, cooling evaporated gases back into liquid, or a combination thereof.

In some embodiments, such as at block 644, regulating the operating temperature with the first thermal circuit can include cooling the first functional circuit through thermal coupling. For example, the first thermal circuit 120 (e.g., the enclosure 124 of FIG. 1) can be directly attached to the first functional circuit or can be attached through a thermal conductor. The electronic device can circulate the cryogenic liquid, supply the cryogenic liquid, cool evaporated gases back into liquid, or a combination thereof for the cryogenic liquid in the enclosure 124 to regulate the operating temperature.

Also for example, at block 624, the electronic device can regulate the operating temperature (e.g., the second operating temperature) of the second functional circuit without using the cryogenic liquid or to compensate for the use of the cryogenic liquid elsewhere. The electronic device can regulate the operating temperature using a second thermal circuit (e.g., the second thermal circuit 140 of FIG. 1, the second thermal circuit 240 of FIG. 2, the second thermal circuit 340 of FIGS. 3A and 3B, etc.) configured to cool the second functional circuit using non-cryogenic means (e.g., such as for air-cooled schemes or liquid-cooling schemes using non-cryogenic liquids) or to offset the use of cryogenic liquids elsewhere outside of the second thermal circuit.

In some embodiments, such as at block 652, regulating the operating temperature with the second thermal circuit can include heating the second functional circuit. For example, when the second functional circuit is submerged in the cryogenic liquid (e.g., such as for cryogenic baths for the overall circuit card), one or more heating elements (e.g., the die-level heater 242 of FIG. 2, the package-level heater 244 of FIG. 2, etc.) can heat the second functional circuit to maintain the operating temperature thereof above the cryogenic levels.

In some embodiments, such as at block 654, regulating the operating temperature with the second thermal circuit can include separately cooling the second thermal circuit without using the cryogenic liquid. For example, when the second functional circuit is sufficiently isolated or removed from the cryogenic liquid, the second thermal circuit can circulate non-cryogenic means, such as air or water) to cool the second functional circuit.

Figure 7:
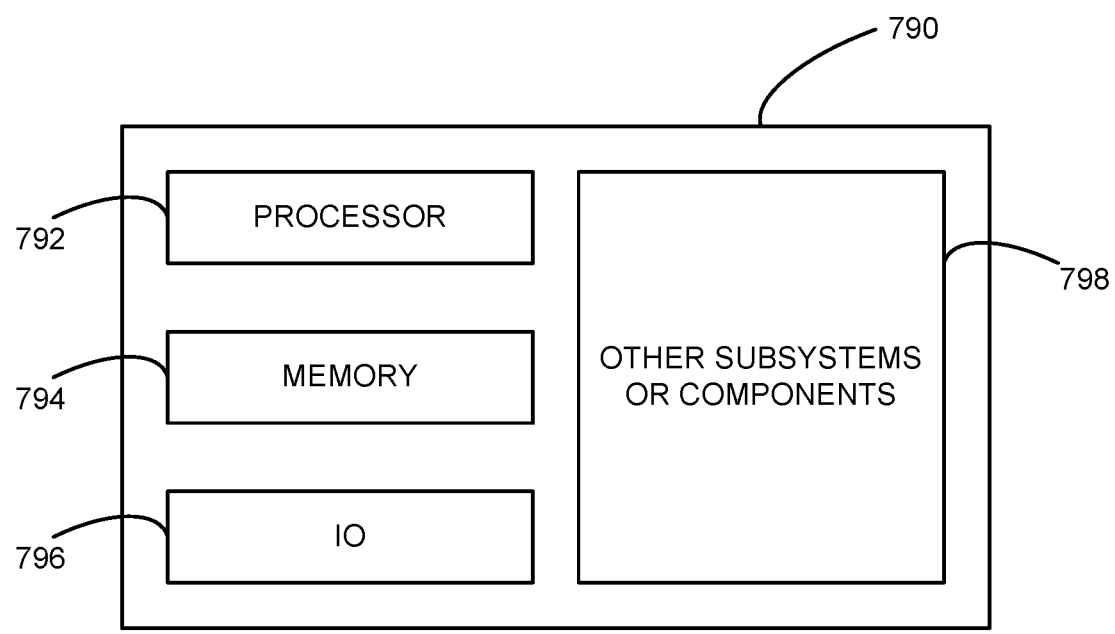
FIG. 7 is a block diagram illustrating a system that incorporates an electronic device in accordance with embodiments of the present technology.

FIG. 7 is a block diagram illustrating a system that incorporates an electronic device in accordance with embodiments of the present technology. Any one of the semiconductor devices having the features described above with reference to FIGS. 1-6 can be incorporated into any of a myriad of larger and/or more complex systems, a representative example of which is system 790 shown schematically in FIG. 7. The system 790 can include a processor 792, a memory 794 (e.g., SRAM, DRAM, flash, and/or other memory devices), input/output devices 796, and/or other subsystems or components 798. The semiconductor assemblies, devices, and device packages described above with reference to FIGS. 1-6 can be included in any of the elements shown in FIG. 7. The resulting system 790 can be configured to perform any of a wide variety of suitable computing, processing, storage, sensing, imaging, and/or other functions. Accordingly, representative examples of the system 790 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 790 include lights, cameras, vehicles, etc. With regard to these and other examples, the system 790 can be housed in a single unit or distributed over multiple interconnected units, e.g., through a communication network. The components of the system 790 can accordingly include local and/or remote memory storage devices and any of a wide variety of suitable computer-readable media.

From the foregoing, it will be appreciated that specific embodiments of the present technology have been described herein for purposes of illustration, but that various modifications may be made without deviating from the disclosure. In addition, certain aspects of the disclosure described in the context of particular embodiments may be combined or eliminated in other embodiments. Further, while advantages associated with certain embodiments have been described in the context of those embodiments, other embodiments may also exhibit such advantages. Not all embodiments need necessarily exhibit such advantages to fall within the scope of the present disclosure. Accordingly, the disclosure and associated technology can encompass other embodiments not expressly shown or described herein.

I claim:

1. An electronic device, comprising:
   a substrate;
   a first functional circuit attached to the substrate;
   a first thermal circuit configured to utilize a cryogenic liquid having a boiling point less than or equal to −150° C. to cool the first functional circuit, wherein the first functional circuit is submerged in the cryogenic liquid that is at a temperature at or below the boiling point;
   a second functional circuit attached to the substrate; and
   a second thermal circuit configured to control thermal energy of the second functional circuit.

2. The electronic device of claim 1, wherein the first thermal circuit includes an enclosure configured to contain the cryogenic liquid.

3. The electronic device of claim 2, wherein the second functional circuit is without direct thermal coupling to the first thermal circuit.

4. The electronic device of claim 1, wherein:
the first thermal circuit includes an enclosure configured to hold the cryogenic liquid for implementing a cryogenic bath;
the second functional circuit and the second thermal circuit are immersed in the cryogenic liquid; and
the second thermal circuit includes one or more heaters configured to heat the second functional circuit.

5. The electronic device of claim 4, wherein the second thermal circuit includes a die-level heater, a package-level heater, or a combination thereof.

6. The electronic device of claim 5, wherein the second thermal circuit further includes:
the package-level heater attached to the substrate and without direct contact to the second functional circuit; and
a component cover attached to the substrate and covering the second functional circuit and the package-level heater, configured to transfer thermal energy generated by the package-level heater to the second functional circuit.

7. The electronic device of claim 1, wherein:
the first thermal circuit includes an enclosure attached over the substrate and enclosing the first functional circuit, configured to hold the cryogenic liquid therein; and
the second functional circuit is outside of the enclosure.

8. The electronic device of claim 7, wherein the substrate includes thermal isolation material under the enclosure, wherein the first functional circuit is enclosed in the enclosure and above the thermal isolation material.

9. The electronic device of claim 8, wherein the second functional circuit is attached directly to and over the thermal isolation material.

10. The electronic device of claim 8, wherein a periphery edge of the thermal isolation material is between the first functional circuit and the second functional circuit.

11. The electronic device of claim 1, wherein the first functional circuit comprises a semiconductor logic device.

12. The electronic device of claim 1, wherein the second functional circuit comprises a semiconductor memory device.

13. The electronic device of claim 1, wherein:
the first thermal circuit is configured to manage an operating temperature of the first functional circuit; and
the second thermal circuit is configured to manage an operating temperature of the second functional circuit above the operating temperature of the first functional circuit.

14. The electronic device of claim 13, wherein the first thermal circuit is configured to manage the operating temperature of the first functional circuit within a threshold range around a boiling point of the cryogenic liquid.

15. The electronic device of claim 13, wherein the cryogenic liquid includes liquid form of argon, helium, or nitrogen.

16. A method of manufacturing an electronic device, comprising:
providing a printed circuit board;
attaching a first functional circuit to the printed circuit board, the first functional circuit configured to process data;
providing a second functional circuit including a heating element therein, wherein the second functional circuit is configured to store data;
attaching the second functional circuit to the printed circuit board; and
submerging the printed circuit board, the first functional circuit, and the second functional circuit in a cryogenic liquid having a boiling point less than or equal to −150° C. to cool the first functional circuit to a temperature at or below the boiling point, wherein the heating element is configured to heat the second functional circuit.

17. A method of operating an electronic device, comprising:
processing data using a first functional circuit and a second functional circuit, wherein the first functional circuit is a logic circuit and the second functional circuit is a data storage circuit;
managing a first operating temperature using a cryogenic liquid having a boiling point less than or equal to −150° C. for the first functional circuit, wherein the first functional circuit is submerged in the cryogenic liquid that is at a temperature at or below the boiling point; and
managing a second operating temperature for the second functional circuit, wherein the second operating temperature is non-cryogenic.

* * * * *